(12) United States Patent
Park

(10) Patent No.: US 6,265,858 B1
(45) Date of Patent: Jul. 24, 2001

(54) VOLTAGE ADJUSTING CIRCUIT

(75) Inventor: Byoung Kwon Park, Seoul (KR)

(73) Assignee: Hyundai Electronics Industries Co., Ltd., Ichon-shi (KR)

( * ) Notice: Subject to any disclaimer, the term of this patent is extended or adjusted under 35 U.S.C. 154(b) by 0 days.

(21) Appl. No.: 09/625,029

(22) Filed: Jul. 25, 2000

(30) Foreign Application Priority Data

Jul. 28, 1999 (KR) .................................................. 99/30901

(51) Int. Cl.[7] .......................................................... G05F 3/16
(52) U.S. Cl. ............................................. 323/313; 323/314
(58) Field of Search ..................................... 323/312, 313, 323/314, 367; 363/62; 327/530, 540

(56) References Cited

U.S. PATENT DOCUMENTS

| | | | | |
|---|---|---|---|---|
| 5,253,205 | * | 10/1993 | Eaton, Jr. ........................ | 365/189.06 |
| 5,682,117 | * | 10/1997 | Choi et al. ........................ | 327/530 |
| 5,757,225 | * | 5/1998 | Tobita ........................ | 323/313 X |
| 5,959,444 | * | 9/1999 | Casper ........................ | 323/313 |

* cited by examiner

*Primary Examiner*—Jessica Han
(74) *Attorney, Agent, or Firm*—Fleshner & Kim, LLP

(57) ABSTRACT

A voltage adjusting circuit includes a half VCC generator that generates a first voltage of a half VCC level or the like in accordance with a precharge input signal, and voltage compensator coupled respectively to output terminals of the half VCC generator. The voltage compensator compensates for a variation of the first voltage generated due to variations of a power supply voltage and a load. The first voltage is increased by supplying electric charges to the output terminals if the first voltage is less than a predetermined level, and the first voltage is decreased by sending the electric charges of the output terminal to the ground if the first voltage is greater than a predetermined level.

21 Claims, 6 Drawing Sheets

VOLTAGE ADJUSTING CIRCUIT

BACKGROUND OF THE INVENTION

1. Field of the Invention

The present invention relates to a voltage adjusting circuit, and in particular, to a voltage adjusting circuit capable of stabilizing a voltage used as a cell plate voltage and a bit line precharge voltage for a dynamic random access memory (DRAM).

2. Background of the Related Art

In the related art, a half VCC voltage is used as a cell plate voltage $V_{CP}$ for a capacitor electrode to determine a quantity of electric charge of a signal, or as a bit line precharge voltage $V_{BLP}$ to determine a standard of signal detection. Accordingly, a half VCC generating circuit must rapidly respond to variations of a power supply voltage VCC and a load to maintain precision of the half VCC voltage.

FIG. 1 illustrates a block diagram of a related art half VCC generating circuit 100 that generates the bit line precharge voltage $V_{BLP}$ and the cell plate voltage $V_{CP}$ in accordance with a bit line precharge signal BLP.

FIG. 2 illustrates a first example of the related art half VCC generating circuit 100 consisting of first and second resistors R1, R2 and having an output voltage Vout represented by:

$$\text{Vout}=(R1/(R1+R2))*VCC. \qquad (1)$$

When the first resistor R1 and the second resistor R2 have substantially equal resistances, the power supply voltage VCC is divided equally by the first and second resistors R1, R2. Thus, the output voltage Vout becomes a half VCC voltage. The first example of the related art half VCC generating circuit 100 includes only the first and second resistors R1, R2, and is thus quite simple.

However, the first related art example has various disadvantages. For example, the related art first example circuit consumes much current.

FIG. 3 illustrates a second example of the related art half VCC generating circuit 100, having a bias circuit 10 that reduces current consumption and a push-pull output circuit 11 that enhances a driving force. The bias circuit 10 includes first and second transistors QN1, QP1 and first and second resistors R1, R2. The first transistor QN1 is of a diode NMOS type, and has a first electrode and a control electrode commonly connected to the first resistor R1 at a first node N1. The first transistor QN1 has a second electrode commonly connected to a first electrode and a control electrode of the second transistor QP1 at a second node N2, wherein the second transistor is of a diode PMOS type. A second electrode and the control electrode of the second transistor QP1 are commonly connected to the second resistor R2 at a third node N3. The first resistor R1 is connected between the first node N1 and the power supply voltage VCC, and the second resistor R2 is connected between the third node N3 and the ground VSS.

The push-pull circuit 11 includes a third NMOS transistor QN2 and a fourth PMOS transistor QP2. The third transistor QN2 has a first electrode connected to the power supply voltage VCC, a control electrode connected to the first node N1, and a second electrode commonly connected to the output voltage Vout and a first electrode of the fourth transistor QP2. The fourth transistor QP2 also has a control electrode connected to the third node N3 and a second electrode connected to the ground VSS.

If the resistances of the first and second resistors R1, R2 are sufficiently large in the bias circuit 10, a voltage of the second node N2 becomes the half VCC voltage, as described above. When threshold voltages of the first through fourth transistors QN1, QP1, QN2, QP2 are equally set at Vt, voltages of the first and third nodes N1, N3 are equal to (VCC/2)+Vt and (VCC/2)−Vt, respectively. As a result, a stable half VCC voltage is generated as the output voltage Vout. A gate-source voltage $V_{GS}$ of the third and fourth transistors QN2, QP2 in the push-pull output circuit 11 is also set at Vt, and thus, the third transistor QN2 and the fourth transistor QP2 are at a state just before being fully transited to the "ON" position, and a through current flows therein.

Accordingly, when the output voltage Vout is varied from the half VCC voltage, one of the third and fourth transistors QN2, QP2 is transited to the "ON" position, and the other is fully transited to the "OFF" position, to rapidly restrict variation of the half VCC voltage. Since N-well bias voltages of the second and fourth transistors QP1, QP2 are a half VCC voltage and a full VCC voltage, respectively, the fourth transistor QP2 receives more back gate effects than the second transistor QP1, and thus, a threshold voltage Vtp2 of the fourth transistor QP2 becomes greater than a threshold voltage Vtp1 of the second transistor QP1. As a result, when the output voltage Vout maintains a half VCC level, the second transistor QP2 is always transited to the "ON" position, and thus the through current does not flow in the push-pull output circuit 11.

Even if the third transistor QN2 and the fourth transistor QP2 are sufficiently increased in size to have a large load capacity, the consumption of power at the push-pull output circuit 11 is not increased. In addition, the current flowing in the bias circuit 10 can be reduced by increasing the values of the first and second resistors R1, R2.

However, the related art half VCC generating circuit has various problems and disadvantages. The cell plate voltage $V_{CP}$ depends on the VCC voltage, especially at a low voltage. Thus, the transient property of the related art circuit can result in various problems. For example, an absolute value difference of the threshold voltages of the NMOS type transistor and the PMOS the transistor becomes a setting error of the half VCC voltage generating circuit. When the NMOS transistor and PMOS transistor each have a process error of ±0.1V, respectively, the absolute value of the error of the half VCC voltage generating circuit equals 0.2V. Further, if the external power supply voltage is decreased, the relative error increases.

In addition, when a capacitance of the cell plate electrode or the bit line is increased four times in accordance with a generation of a dynamic random access memory DRAM, the driving capacity of the half VCC voltage generating circuit does not improve significantly, thereby worsening a transient response property of the half VCC generating circuit. A significant amount of time is thus required to obtain the stable half VCC voltage when the power supply voltage is applied. Furthermore, the half VCC generating circuit cannot rapidly respond to a sharp variation of the load or a VCC variation during operation of the DRAM.

FIG. 4 graphically illustrates a variation of the half VCC voltage according to the load variation in an active mode and a standby mode that results in various problems and disadvantages. The half voltage outputted from the half VCC voltage generating circuit 100 maintains a constant level at an initial operation, but decreases due to the current consumption in the active mode, including a read/write operation and a sense amp operation. If the half VCC voltage becomes lower than ΔV, a defect may occur in a cell data.

Additionally, the half VCC voltage cannot maintain a predetermined level and causes voltage bouncing when the standby mode (i.e., a refresh operation) has a load. This phenomenon often takes place during an auto refresh operation, thus influencing the DRAM operation.

SUMMARY OF THE INVENTION

It is an object of the present invention to provide a voltage adjusting circuit that stably maintains a voltage, regardless of variations of an external voltage and a load.

It is another object of the present invention to provide a voltage adjusting circuit that can respond rapidly to a sharp variation in the load or VCC during operation, and improve a transient response property of the voltage adjusting circuit.

In order to achieve the above-described object of the present invention, there is provided a voltage adjuster circuit including a half VCC circuit configured to output a first voltage of a half VCC level in accordance with a precharge signal, and at least one voltage compensator coupled to an output terminal of the half VCC circuit configured to compensate for a variation of the first voltage. When the first voltage is lower than a predetermined level, the voltage compensating unit increases a level of the first voltage by supplying electric charges to the output terminal. If the first voltage is higher than a predetermined level, the voltage compensating unit decreases the level of the first voltage by taking out the electric charges of the output terminal to the ground.

A voltage adjusting circuit is provided that comprises a reference voltage generator circuit configured to divide a first prescribed voltage, and generate first and second reference voltages. The voltage adjusting circuit also includes a comparing circuit coupled to the reference voltage generator circuit, configured to compare the first and second reference voltages generated by the reference voltage generator circuit with an inputted first voltage, and configured to generate first and second control signals. Further, the voltage adjusting circuit includes an output circuit coupled to the comparing circuit, configured to stabilize the first voltage based on the first and second control signals.

Additional advantages, objects, and features of the invention will be set forth in part in the description which follows and in part will become apparent to those having ordinary skill in the art upon examination of the following or may be learned from practice of the invention. The objects and advantages of the invention may be realized and attained as particularly pointed out in the appended claims.

BRIEF DESCRIPTION OF THE DRAWINGS

The invention will be described in detail with reference to the following drawings in which like reference numerals refer to like elements, and wherein.

DETAILED DESCRIPTION OF PREFERRED EMBODIMENTS

Figure 1:
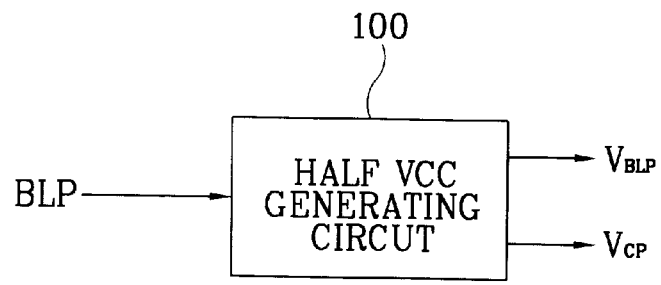
FIG. 1 illustrates a block diagram of a related art half VCC generating circuit.
Figure 2:
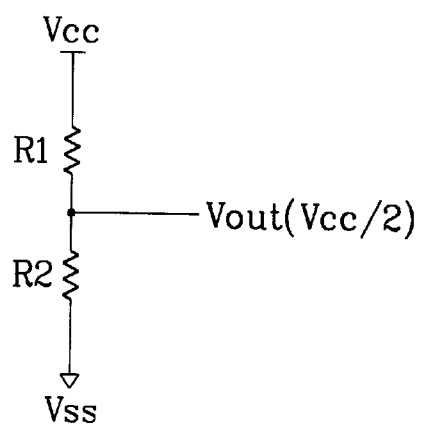
FIG. 2 illustrates a first example of the related art half VCC generating circuit having a plurality of resistors.
Figure 3:
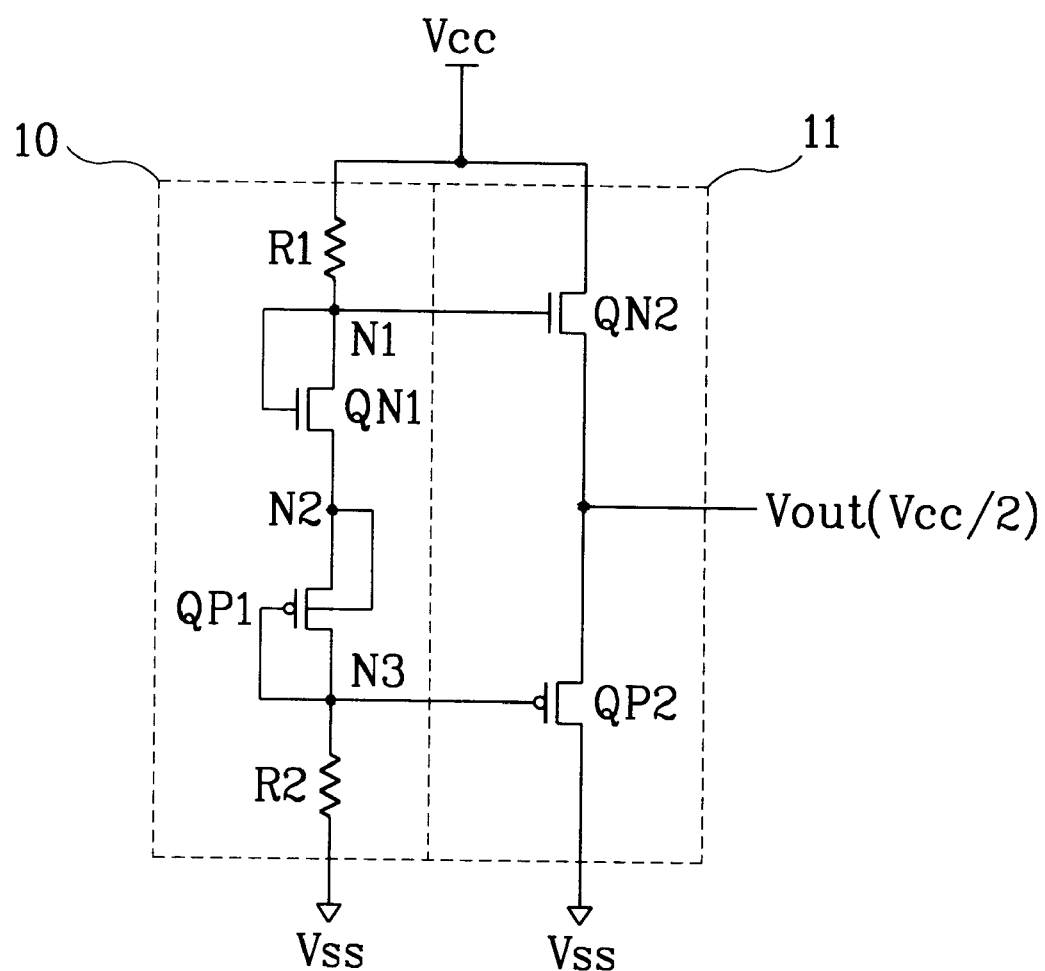
FIG. 3 illustrates a second example of the related art half VCC generating circuit having a bias circuit and a push-pull output circuit.
Figure 4:
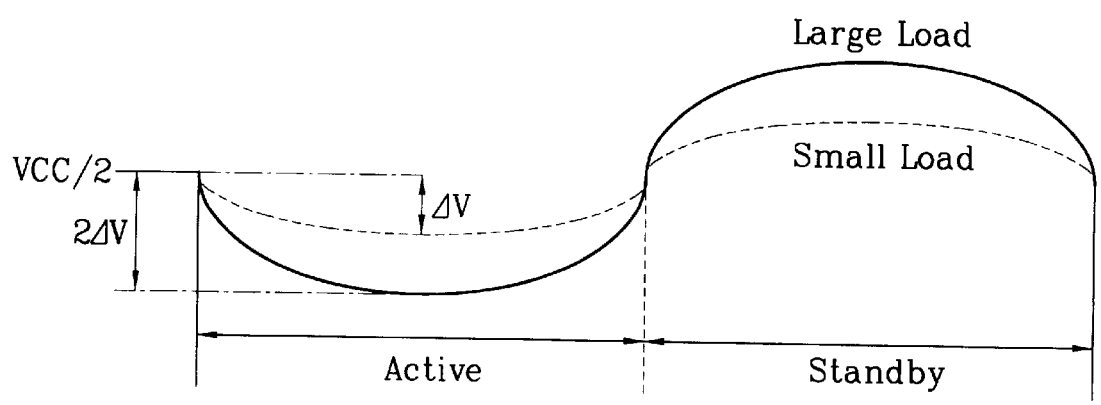
FIG. 4 illustrates a variation of the related art half VCC voltage resulting from a load variation in an active mode and a standby mode in the configurations of FIGS. 2 and 3.
Figure 5:
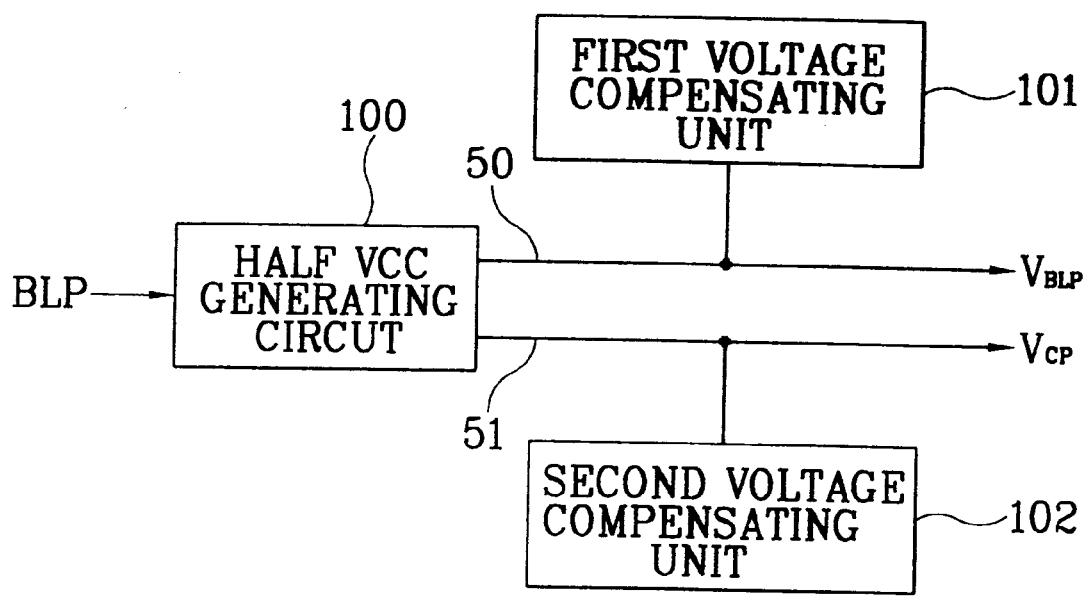
FIG. 5 illustrates a block diagram of a voltage adjusting circuit according to a preferred embodiment of the present invention.

FIG. 5 illustrates a voltage adjusting circuit according to a preferred embodiment of the present invention. The voltage adjusting circuit includes a half VCC generating circuit 100 that receives a bit line precharge signal BLP, and first and second voltage compensating circuits 101, 102 coupled to first and second output terminals 50, 51 of the half VCC generating circuit 100 that stabilizes a bit line precharge voltage $V_{BLP}$ and a cell plate voltage $V_{CP}$, respectively.

In the preferred embodiment, the bit line precharge voltage $V_{BLP}$ and the cell plate voltage $V_{CP}$ generated by the half VCC generating circuit 100 are received by the first and second voltage compensating circuits 101, 102, respectively, through the first and second output terminals 50, 51, respectively. The first voltage compensating circuit 101 compares the first and second reference voltages Vref1, Vref2 with the bit line precharge voltage $V_{BLP}$, and compensates for a variation (i.e., bouncing) of the bit line precharge voltage $V_{BLP}$. The second voltage compensating circuit 102 compares the first and second reference voltages Vref1, Vref2 with the cell plate voltage $V_{CP}$, and compensates for a variation (i.e., bouncing) of the cell plate voltage $V_{CP}$.

The first and second voltage compensating circuits 101, 102 are substantially identical in constitution and operation, and thus the discussion of the first voltage compensating circuit 101 can be applied to the second voltage compensating circuit 102, wherein the cell plate voltage $V_{CP}$ instead of the bit line precharge voltage $V_{BLP}$ is received from the half VCC generating circuit 100.

Figure 6:
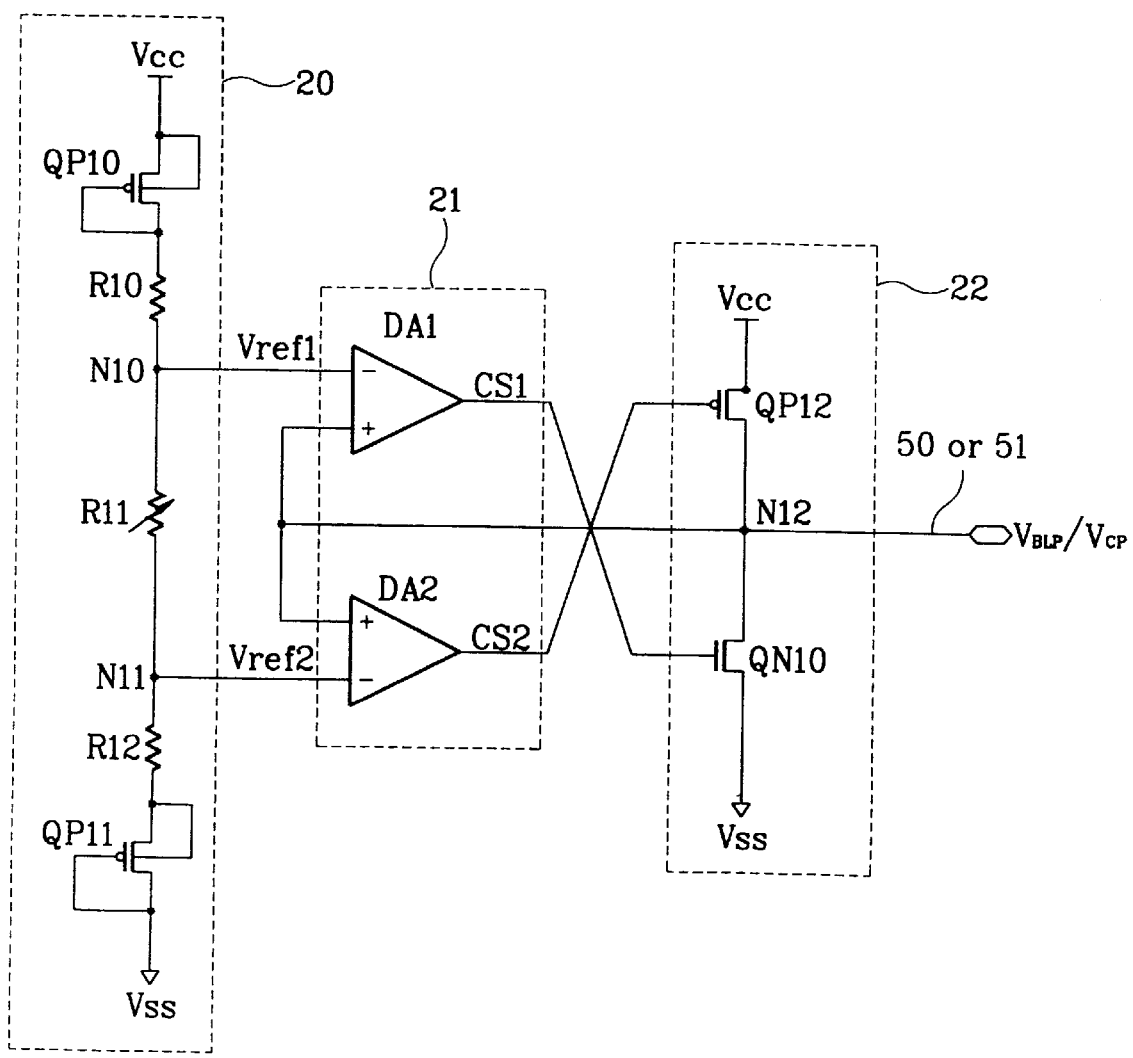
FIG. 6 illustrates additional details of the voltage compensating circuit according to the preferred embodiment of the present invention.

Because the first and second voltages compensating circuits 101, 102 are substantially similar, FIG. 6 illustrates a detailed diagram of the first voltage compensating circuit 101. A reference voltage generating circuit 20 divides the power supply voltage, and generates first and second reference voltages Vref1, Vref2 and comparing circuit 21 compares the first and second reference voltages Vref1, Vref2 with the bit line precharge voltage $V_{BLP}$. The comparing circuit 21 generates first and second control signals CS1, CS2 that are received by an output circuit 22 that stabilizes the bit line precharge voltage $V_{BLP}$ from the first output terminal 50 in accordance with the first and second control signals CS1, CS2.

The reference voltage generating circuit 20 illustrated in FIG. 6 includes first and second transistors QP10, QP11, first and second resistors R10, R12, and a variable resistor R11. The first and second transistors QP10, QP11 are substantially similar in size and are of a diode PMOS type, and the first and second resistors R10, R12 have a resistance substantially higher than that of the variable resistor R11. The first resistor R11 and the second resistor R12 also have substantially similar resistances. Further, the variable resistor R11 preferably includes a plurality of small resistors coupled in series, and is fuse- or option-processed.

The first transistor QP10 is coupled in series between the power supply voltage VCC and the first resistor R10, and has a first electrode coupled to the power supply voltage VCC, a second electrode coupled in series to the first resistor R10, and a control electrode commonly coupled to the first resistor R10. The first resistor R10 is also coupled in series to the variable resistor R11 at a first node N10 where the first reference voltage Vref1 is generated.

The second transistor QP11 is coupled in series between the ground VSS and the second resistor R12, wherein a control electrode is commonly coupled to the ground VSS, a first electrode is coupled in series to the ground, and a second electrode is coupled in series to the second resistor R12. The second resistor R12 is also coupled in series to the variable resistor R11 at a second node N11, where the second reference voltage Vref2.

The comparing circuit 21 includes first and second differential amplifiers DA1, DA2. The first differential amplifier DA1 has first and second inputs coupled to the first node N10 and the bit line precharge voltage $V_{BLP}$ or the like. The first differential amplifier DA1 compares the first reference voltage Vref1 at an inverted terminal with the bit line precharge voltage $V_{BLP}$ or the like, from the first output terminal 50 or the cell plate voltage $V_{CP}$ from the second output terminal 51, or the like, at a non-inverted terminal and generates the first control signal CS1. The second differential amplifier DA2 has first and second inputs coupled to the second node N11 and the bit line voltage $V_{BLP}$ from the first output terminal 50. The second differential amplifier DA2 compares the second reference voltage Vref2 at an inverted terminal with the bit line precharge voltage $V_{BLP}$ or the like at a non-inverted terminal and generates the second control signal CS2.

The output circuit 22 includes a third transistor QP12 of the PMOS type and a fourth transistor QN10 of the NMOS type coupled in series between the power supply voltage VCC and the ground VSS, and controlled according to the first and second control signals CS1, CS2. A control electrode of the third transistor QP12 receives the second control signal CS2 and a control electrode of the fourth transistor QN10 receives the first control signal CS1. First electrodes of the third and fourth transistors QP12, QN10 are coupled to the power supply voltage VCC and ground Vss, respectively. Second electrodes of the third and fourth transistors QP12, QN10 are commonly coupled at a third node N12 to the bit line precharge voltage $V_{BLP}$ or the like, in the case of the first voltage compensating circuit 101.

Further, the above-discussed features of the first voltage compensating circuit 101 are substantially similar to the features of the second voltage compensating circuit 102, except that the first voltage compensating circuit 101 receives the bit line precharge voltage $V_{BLP}$ from the first output terminal 50, whereas the second voltage compensating circuit 102 receives the cell plate voltage from the second output terminal 51. Thus, the above-discussed features of the first voltage compensating circuit 101 apply to the second voltage compensating circuit 102, with the substitution of the cell plate voltage $V_{CP}$ from the second output terminal 51 for the bit line precharge voltage $V_{BLP}$ from the first output terminal 50 in the second voltage compensating circuit 102.

In operations of the first voltage compensating circuit 101, when the power supply voltage VCC is applied to the reference voltage generating circuit 20, the first reference voltage Vref1 having a value of VCC/2+ΔV is applied to the first node N10, and the second reference voltage Vref2 having a value of VCC/2−ΔV is applied to the second node N11. The values of the first and second references voltages Vref1, Vref2 are based on the first and second resistances R10, R12 having an identical resistance value, and first and second resistors R10, R12 having a substantially larger value than the variable resistance R11.

When the first and second reference voltages Vref1, Vref2 are generated from the reference voltage generating circuit 20, the first differential amplifier DA1 of the comparing circuit 21 differentially amplifies the first reference voltage precharge Vref1 received at the inverted terminal, and the bit line precharge voltage $V_{BLP}$ received at the non-inverted terminal. The second differential amplifier DA2 differentially amplifies the second reference voltage Vref2 received at the inverted terminal, and the bit line precharge voltage $V_{BLP}$ received at the non-inverted terminal.

If the bit line precharge voltage $V_{BLP}$ is less than the first reference voltage Vref1, and greater than the second reference voltage Vref2, the first and second control signals CS1, CS2 generated by the first and second differential amplifiers DA1, DA2, respectively are transited to a "LOW" and a "HIGH" level, respectively. As a result, the third transistor QP12 and the fourth transistor QN10 of the output circuit 22 are transited to the "OFF" position based on the first and second control signals CS1, CS2. Thus, the bit line precharge voltage $V_{BLP}$ is not varied.

If the bit line precharge voltage $V_{BLP}$ is less than the second reference voltage Vref2, the first and second control signals CS1, CS2 generated by the first and second differential amplifiers DA1, DA2 are transited to a "LOW" level. Accordingly, the third transistor QP12 is transited to the "ON" position, and the fourth transistor QN10 is transited to the "OFF" position. As a result, the current flows to the third node N12 through the third transistor QP12 which is in the "ON" position, thereby stably maintaining the level of the bit line precharge voltage $V_{BLP}$.

Alternatively, when the level of the bit line precharge voltage $V_{BLP}$ is greater than the first reference voltage Vref1, the first and second control signals CS1, CS2 generated by the first and second differential amplifiers DA1, DA2 are transited to a "HIGH" level. Accordingly, the third transistor QP12 is transited to the "OFF" position, and the fourth transistor QN10 is transited to the "ON" position. As a result, the current flows to the ground VSS via the fourth transistor QN10 which is in the "ON" position, thereby stably maintaining the level of the bit line precharge voltage $V_{BLP}$.

Figure 7:
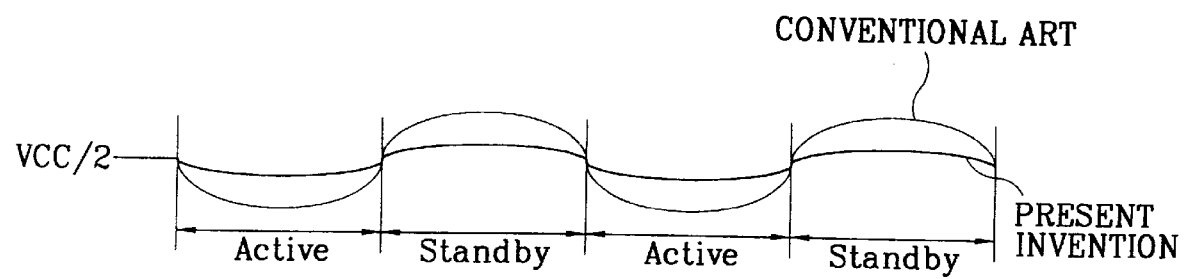
FIG. 7 illustrates a variation of the half VCC voltage resulting from a load variation in an active mode and a standby mode according to a preferred embodiment of the present invention.

As shown in FIG. 7, even if the bit line precharge voltage $V_{BLP}$ (e.g., the cell plate voltage $V_{CP}$ or the like) is varied because of variations such as in an external power supply voltage VCC and/or a load, the preferred embodiment of a voltage adjusting circuit in accordance with the present invention can obtain the stabilized bit line precharge voltage $V_{BLP}$, as compared with the related art. In the preferred embodiment of the present invention shown in FIG. 7, the first voltage compensating circuit 101 is exemplified. When the second voltage compensating circuit 102 is employed, a substantially similar result may be obtained for the cell plate voltage $V_{CP}$. That is, the cell plate voltage $V_{CP}$ may be maintained at the half VCC level.

However, the present invention is not intended to be so limited. For example, additional voltages in the DRAM can be stabilized other than the bitline precharge $V_{BLP}$, the cell plate voltage $V_{CP}$ or the like. Further, the stabilized voltage can have other values than the half VCC level such as one third (⅓) VCC or one quarter (¼) VCC.

As described above, preferred embodiments of a voltage adjusting circuit according to the present invention have various advantages. For example, the voltage adjusting circuit in accordance with the preferred embodiment of the present invention can stably maintain the cell plate voltage $V_{CP}$ and the bit line precharge voltage $V_{BLP}$ that can vary due to the variations of the external power supply voltage and the load, by rapidly responding to such variations.

The foregoing embodiments and advantages are merely exemplary and are not to be construed as limiting the present invention. The present teaching can be readily applied to other types of apparatuses. The description of the present invention is intended to be illustrative, and not to limit the scope of the claims. Many alternatives, modifications, and variations will be apparent to those skilled in the art. In the claims, means-plus-function clauses are intended to cover the structures described herein as performing the recited function and not only structural equivalents but also equivalent structures.

What is claimed is:

1. A voltage adjusting circuit, comprising:
    a first transistor having a first electrode coupled to a first prescribed voltage and a second electrode coupled to a first resistor;
    a second transistor having a first electrode coupled to a second resistor and a second electrode coupled to a second prescribed voltage;
    a third resistor coupled in series to the first resistor at a first node and the second resistor at a second node, wherein a first reference voltage is generated at the first node and a second reference voltage is generated at the second node;
    a first differential amplifier configured to differentially amplify the first reference voltage received by a first input terminal and a first voltage received by a second input terminal to output a first control signal;
    a second differential amplifier configured to differentially amplify the second reference voltage received by a first input terminal and the first voltage received by a second input terminal to output a second control signal; and
    a third transistor and a fourth transistor coupled in series at a third node between a third prescribed voltage and a fourth prescribed voltage, and controlled based on the first and second control signals received by the fourth and third transistor, respectively, and wherein the third and fourth transistors stabilize the first voltage at the third node.

2. The circuit of claim 1, wherein the first and second transistors are diode type transistors, the first and second resistors have a substantially similar resistance that is substantially larger than that of the third resistor, and the first and second prescribed voltages are respectively a power supply voltage and a general voltage, and wherein the first voltage is a prescribed fraction of the power supply voltage, and wherein the voltage adjusting circuit increases the first voltage by supplying the current through the third transistor when the first and second control signals are first prescribed levels, and decreases the first voltage by supplying the current through the fourth transistor when the first and second control signals are second prescribed levels.

3. A voltage adjustor circuit, comprising:
    a half power supply voltage (VCC) circuit configured to output a first voltage of a half VCC level in accordance with a precharge signal; and
    at least one voltage compensator coupled to an output terminal of the half VCC circuit configured to compensate for a variation of the first voltage, wherein each voltage compensator comprises,
        a reference voltage generator configured to generate first and second reference voltages,
        a comparing circuit, coupled to the reference voltage generator, configured to compare the first and second reference voltages generated by the reference voltage generating circuit with the first voltage, and configured to generate a first control signal and a second control signal, respectively, and
        an output circuit, coupled to the comparing circuit, configured to stabilize the level of the first voltage based on the first control signal and second control signal.

4. The circuit of claim 3, wherein the reference voltage generator comprises:
    a first transistor having a first electrode coupled to the power supply voltage, a second electrode coupled to a first terminal of a first resistor, and a control electrode coupled to the first terminal of the first resistor;
    a second transistor having a first electrode coupled to a first terminal of a second resistor, a second electrode coupled to a ground voltage, and a control electrode coupled to the ground voltage; and
    a variable resistor coupled in series to a second terminal of the first resistor at a first node and a second terminal of the second resistor at a second node, wherein the first reference voltage is generated at the first node and the second reference voltage is generated at the second node.

5. The circuit of claim 4, wherein the first and second transistors are diode type PMOS transistors.

6. The circuit of claim 4, wherein the first and second resistors have a substantially similar resistance value, and the variable resistor comprises a plurality of small resistors with respect to the first and second resistors.

7. The circuit of claim 4, wherein the first and second resistors have substantially large resistances, and the variable resistor is one of fuse-processed and option-processed.

8. The circuit of claim 4, wherein the comparing circuit comprises:
    a first differential amplifier configured to differentially amplify the first reference voltage received by a first terminal from the reference voltage generator and the first voltage received by a second terminal from the half VCC circuit; and
    a second differential amplifier configured to differentially amplify the second reference voltage received by a first terminal from the reference voltage generator and the first voltage received by a second terminal from the half VCC circuit, and wherein the output circuit comprises a third transistor and a fourth transistor coupled in series between the power supply voltage and a ground voltage, and controlled in accordance with the first and second control signals received by the fourth and third transistors, respectively.

9. The circuit of claim 3, wherein the comparing circuit comprises:
    a first differential amplifier configured to differentially amplify the first reference voltage received by a first terminal from the reference voltage generator and the first voltage received by a second terminal from the half VCC circuit; and
    a second differential amplifier configured to differentially amplify the second reference voltage received by a first terminal from the reference voltage generator and the first voltage received by a second terminal from the half VCC circuit.

10. The circuit of claim 3, wherein the output circuit comprises a third transistor and a fourth transistor coupled in series between the power supply voltage and a ground voltage, and controlled in accordance with the first and second control signals received by the fourth and third transistor, respectively.

11. The circuit of claim 10, wherein the third transistor is a PMOS transistor, and the fourth transistor is an NMOS transistor.

12. The circuit of claim 10, wherein the output circuit maintains a constant level of the first voltage when the first and second control signal are at a low level and a high level, respectively.

13. The circuit of claim 10, wherein the output circuit increases the first voltage by supplying the current to the output terminal through the third transistor when the first and second control signals are at a low level, and decreases the first voltage by blocking the current from the output terminal to the ground voltage via the fourth transistor when the first and second control signals are at a high level.

14. The circuit of claim 3, wherein the first voltage is one of a cell plate voltage and a bit line precharge voltage.

15. A voltage adjusting circuit comprising:
a reference voltage generator circuit configured to divide a first prescribed voltage, and generate first and second reference voltages;
a comparing circuit, coupled to the reference voltage generator circuit, configured to compare the first and second reference voltages generated by the reference voltage generator circuit with an inputted first voltage, and configured to generate first and second control signals; and
an output circuit, coupled to the comparing unit, configured to stabilize the first voltage based on the first and second control signals.

16. The circuit of claim 15, wherein the reference voltage generating circuit comprises:
a first transistor having a first electrode coupled to the first prescribed voltage, a second electrode coupled in series to a first resistor, and a control electrode coupled to the first resistor;
a second transistor having a first electrode coupled in series to a second resistor, a second electrode coupled to a second prescribed voltage, and a control electrode coupled to the second prescribed voltage; and
a third resistor coupled in series to the first resistor at a first node and the second resistor at a second node, wherein the first reference voltage is generated at the first node and the second reference voltage is generated at the second node.

17. The circuit of claim 16, wherein the first and second transistors are diode type PMOS transistors, the first and second resistors have a substantially similar resistance that is substantially larger than that of a variable resistor being the third resistor, and the first and second prescribed voltages are respectively a power supply voltage and a general voltage, and wherein the first voltage is one of half the power supply voltage, one third of the power supply voltages one quarter of the power supply voltage and a prescribed amount based on the power supply voltage.

18. The circuit of claim 8, wherein the variable resistor comprises a plurality of small resistors coupled in series.

19. The circuit of claim 15, wherein the comparing circuit comprises:
a first differential amplifier configured to differentially amplify the first reference voltage received by an inverted terminal from the reference voltage generator circuit and the first voltage received by a non-inverted terminal; and
a second differential amplifier configured to differentially amplify the second reference voltage received by an inverted terminal from the reference voltage generator circuit and the second voltage received by a non-inverted terminal.

20. The circuit of claim 15, wherein the output circuit comprises a third transistor and a fourth transistor coupled in series between the first prescribed voltage and a second prescribed voltage, and controlled based on the first and second control signals received by the fourth and third transistor, respectively, and wherein the output circuit maintains a constant level of the first voltage when the first and second control signals are at a low level and a high level, respectively, and the third transistor is a PMOS transistor and the fourth transistor is a NMOS transistor.

21. The circuit of claim 20, wherein the output circuit increases the first voltage by supplying the current through the third transistor when the first and second control signals are at a low level, and decreases the first voltage by supplying the current to the reference voltage via the fourth transistor when the first and second control signals are at a high level.

* * * * *